(12) United States Patent
Sinkunas et al.

(10) Patent No.: US 6,753,477 B1
(45) Date of Patent: Jun. 22, 2004

(54) FLATWIRE JUMPER PATCH

(76) Inventors: Peter J. Sinkunas, 7111 Foxcreek Dr., Canton, MI (US) 48187; Andrew Z. Glovatsky, 44851 Partridge Dr., Plymouth, MI (US) 48170; Xu Song, 45443 Muirfield Dr., Canton, MI (US) 48188; Anne M. Sullivan, 629 Elmwood, Dearborn, MI (US) 48124; Yutaka Kawase, 4-25-2, Kiyamata, Tsuzuki-ku, Yokohama-shi, Kanagawa (JP), 224-0021

( * ) Notice: Subject to any disclaimer, the term of this patent is extended or adjusted under 35 U.S.C. 154(b) by 0 days.

(21) Appl. No.: 10/426,304

(22) Filed: Apr. 30, 2003

(51) Int. Cl.[7] ............................................. H01B 7/08
(52) U.S. Cl. ................................................ 174/117 FF
(58) Field of Search ........................... 174/70 C, 72 R, 174/84 R, 88 R, 100, 117 A, 117 F, 117 FF; 439/492, 494, 495, 507

(56) References Cited

U.S. PATENT DOCUMENTS

| | | | |
|---|---|---|---|
| 3,891,293 A | | 6/1975 | Jones |
| 4,635,359 A | * | 1/1987 | Nozick .................. 174/117 FF |
| 4,749,368 A | | 6/1988 | Mouissie |
| 4,860,088 A | | 8/1989 | Smith et al. |
| 4,864,081 A | | 9/1989 | Bates |
| 5,036,379 A | | 7/1991 | Smith et al. |
| 5,356,308 A | * | 10/1994 | Toba et al. .................. 439/495 |
| 5,742,484 A | | 4/1998 | Gillette et al. |
| 5,857,259 A | * | 1/1999 | Johnston ...................... 29/858 |
| 5,917,149 A | | 6/1999 | Barcley et al. |
| 5,936,850 A | | 8/1999 | Takahashi et al. |
| 6,024,596 A | * | 2/2000 | Tanaka et al. .............. 439/492 |
| 6,123,551 A | | 9/2000 | Westfall |
| 6,184,469 B1 | * | 2/2001 | Conti ..................... 174/72 TR |
| 6,247,951 B1 | * | 6/2001 | Di Liello et al. ........... 439/329 |
| 6,299,469 B1 | * | 10/2001 | Glovatsky et al. .......... 439/329 |

* cited by examiner

*Primary Examiner*—Dean A. Reichard
*Assistant Examiner*—Adolfo Nino
(74) *Attorney, Agent, or Firm*—Brinks Hofer Gilson & Lione

(57) ABSTRACT

A flatwire assembly includes a pair of elongate flatwire segments that are interconnected with a thin, flexible patch that overlies the opposed longitudinal ends of the segments. Conductive traces on the bottom face of the patch are electrically connected to the respective conductive traces of the segments by solder layers that, upon reflow under heat and pressure, respectively extend past an edge of the patch, whereupon visual confirmation of the solder joints between the traces of the patch and the segment is readily obtained. A layer of a thermally-activated or pressure-sensitive adhesive is disposed between the patch and each segment to further mechanically couple the patch to each segment during solder reflow. Longitudinal extensions of the patch substrate are bonded by the adhesive layer to respective portions of the segments farther removed from the segment ends than the solder layer extensions provide enhanced strain relief.

12 Claims, 4 Drawing Sheets

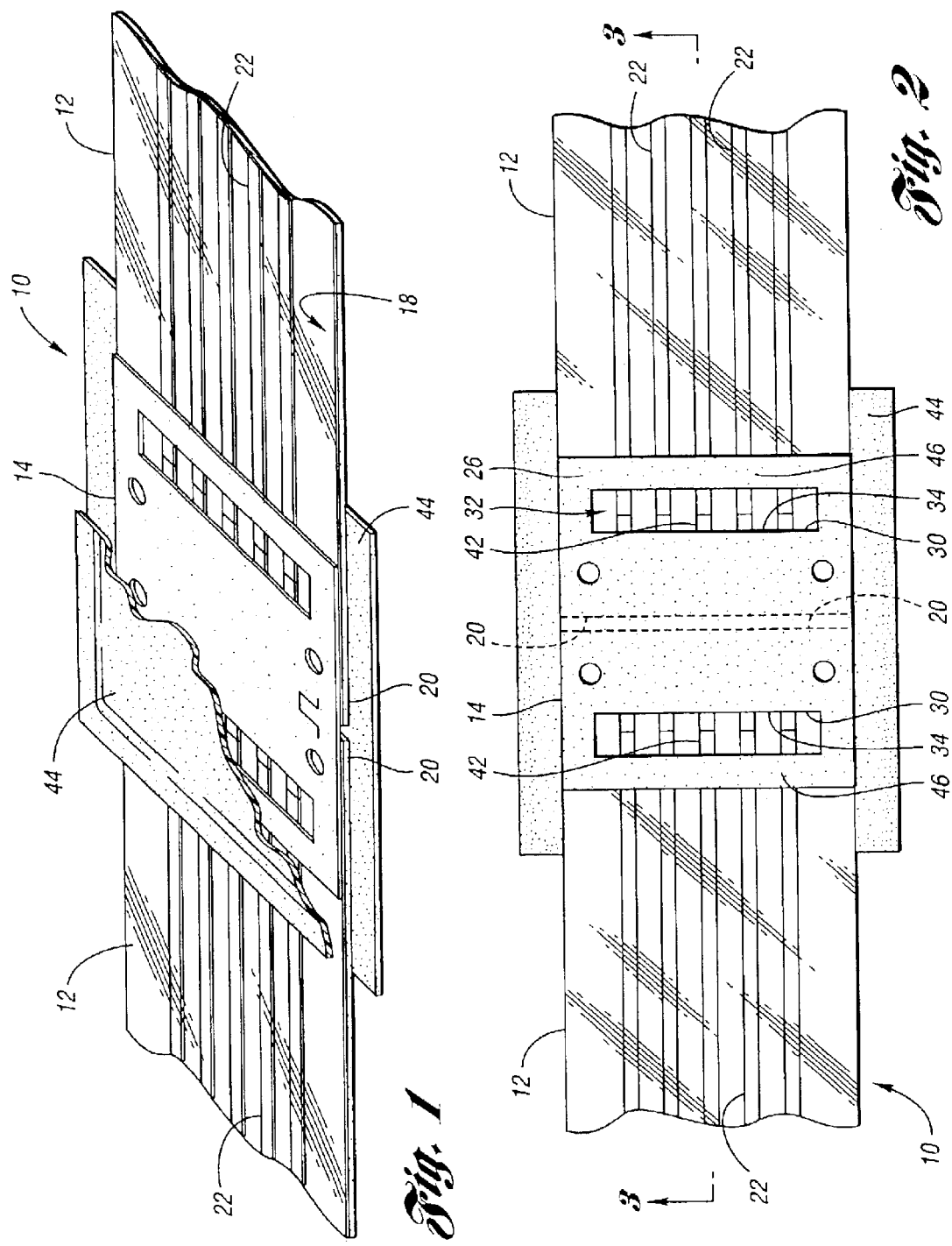

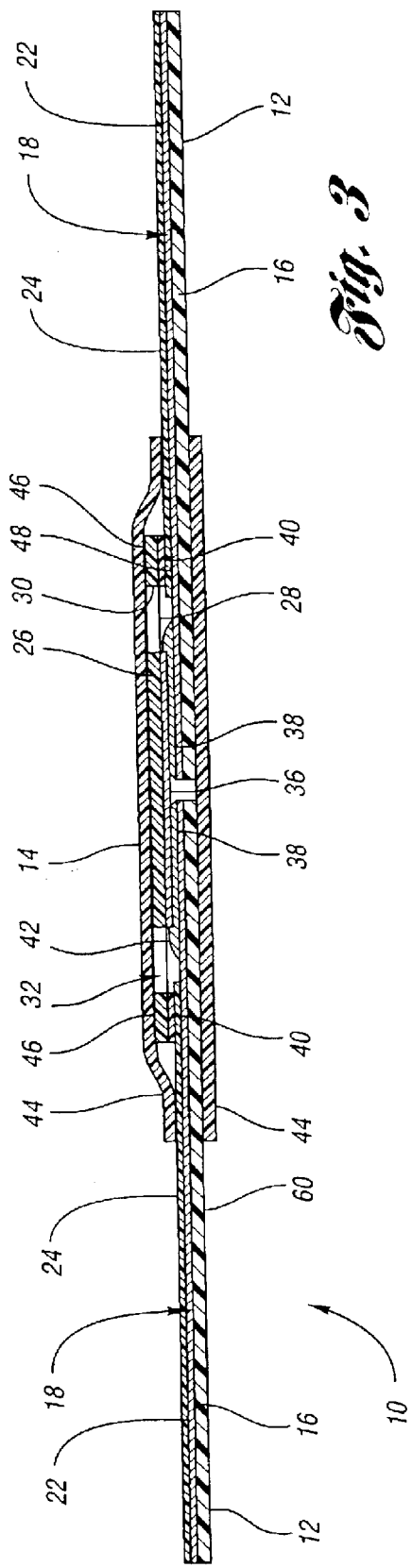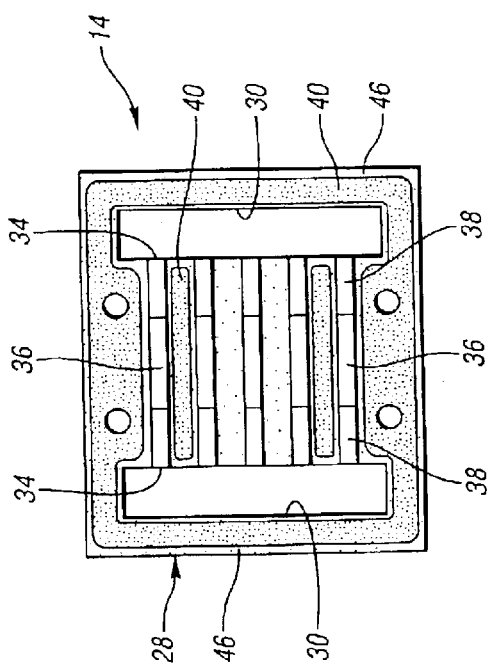

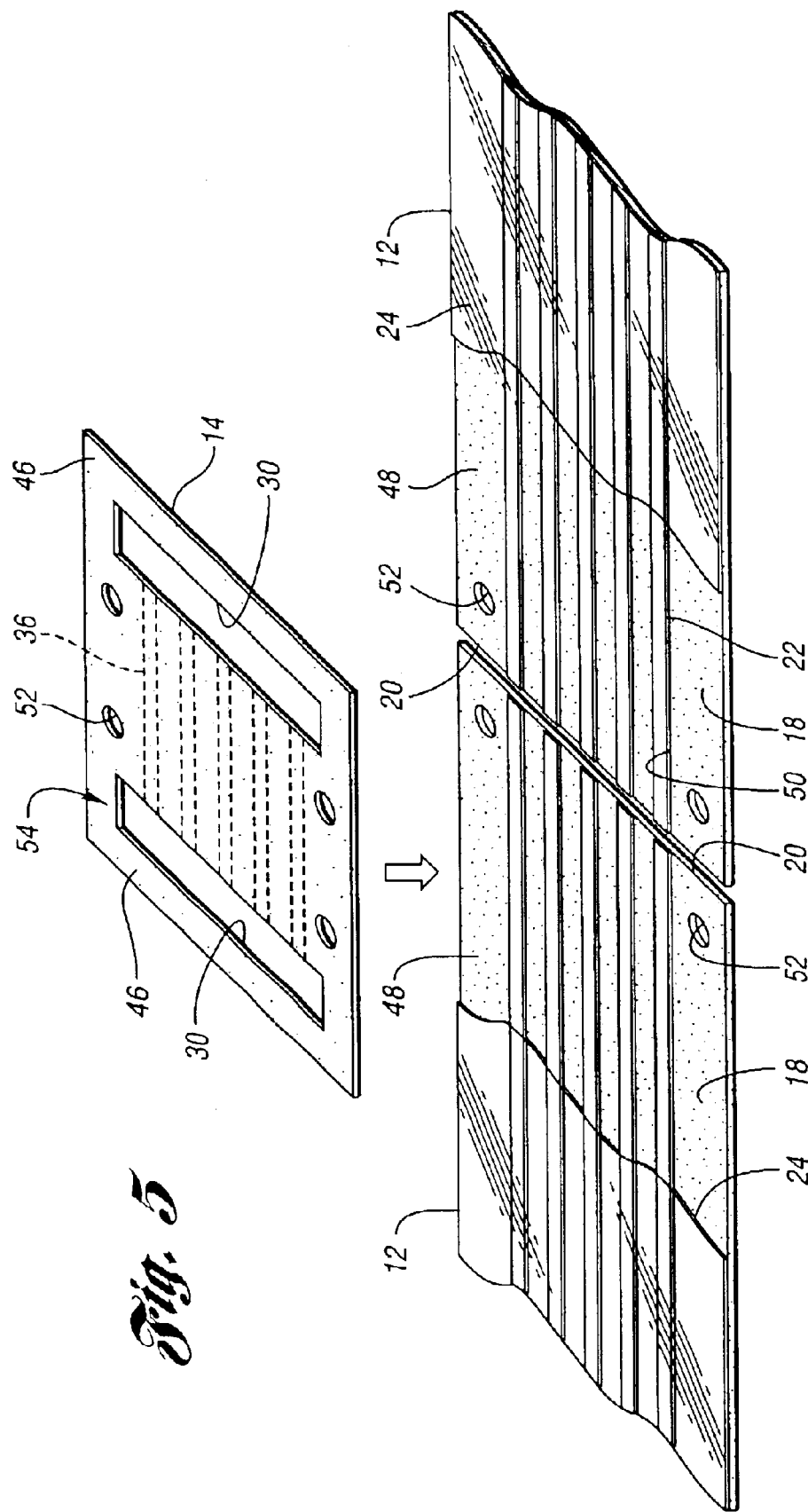

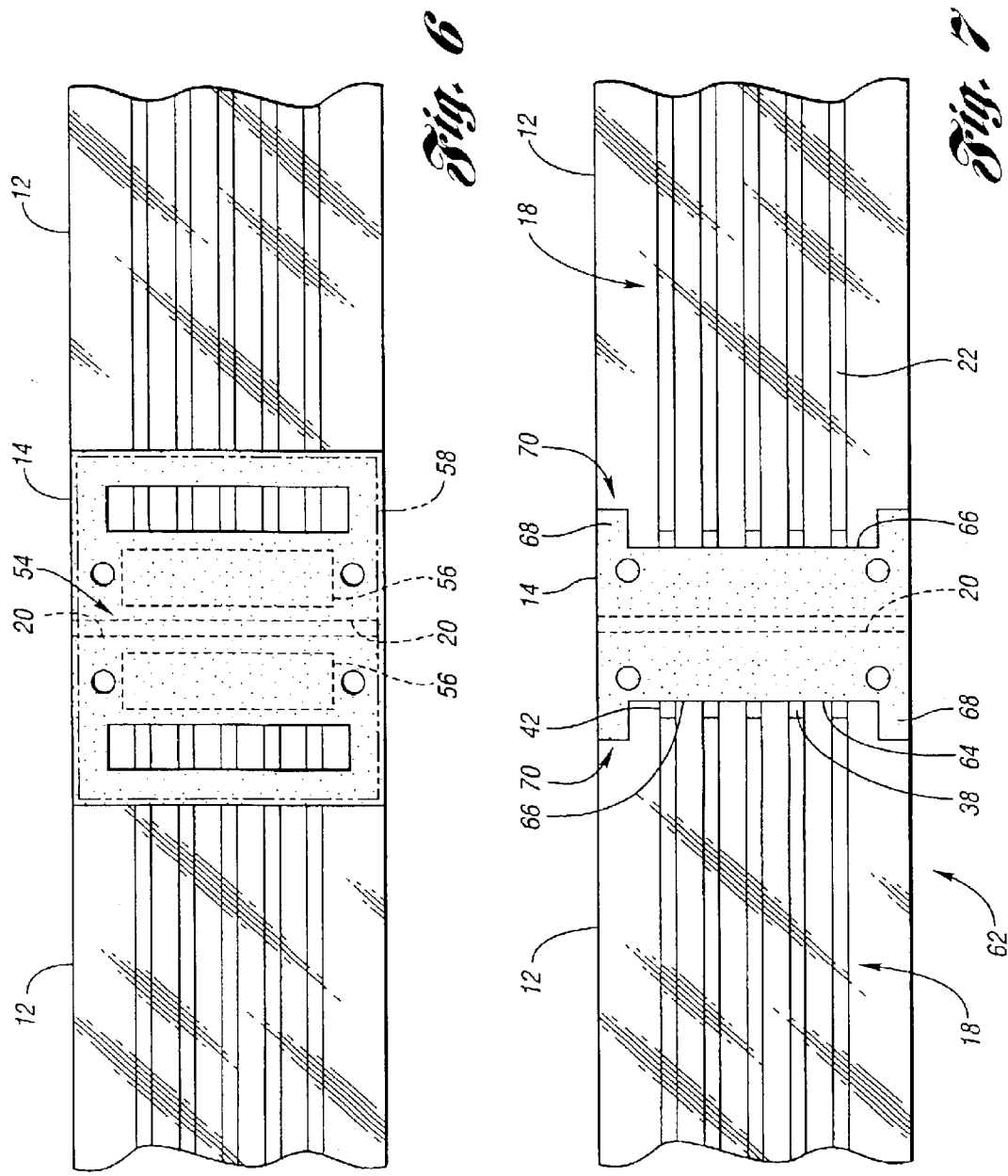

FLATWIRE JUMPER PATCH

FIELD OF INVENTION

The invention relates generally to electrically- and mechanically-interconnected flatwire segments.

BACKGROUND OF THE INVENTION

In order to reduce vehicle weight while increasing the reliability of a vehicle's electrical systems, the automotive industry is increasingly utilizing flexible flatwire busses extending between various electronic sites and/or systems in a vehicle. Each flatwire bus is preferably formed of a plurality of interconnected flatwire segments in order to afford greater flexibility in the assembly and customization of the vehicle's electrical system while further capitalizing on an increased integration of such bus segments into other vehicle components, such as HVAC ducts, instrument panel structures, and the like.

In accordance with a known approach for interconnecting such flatwire segments, the segments are respectively outfitted with male and female connectors, whereupon the connectors are joined and locked together to complete the interconnection. Much attention has been focused on achieving a satisfactory electrical connection between the conductive traces of each flatwire segment and the corresponding connector tips. However, such use of electrical connectors along the length of the resulting flatwire bus may nonetheless degrade bus performance, while the weight and bulk of such electrical connectors continue to limit design flexibility and attendant gains in system integration.

BRIEF SUMMARY OF THE INVENTION

It is an object of the invention to provide a flatwire assembly featuring a mechanical and electrical interconnection between a pair of flatwire segments, and an associated method for interconnecting the pair of flatwire segments, that overcomes the deficiencies of the prior art.

Under the invention, two flatwire segments are mechanically joined, and the respective conductive traces of the flatwire segments are electrically interconnected, by a flatwire jumper patch that is secured to the top face of the segments' opposed longitudinal ends by a layer of a suitable adhesive. Conductive traces exposed on the top face of each flatwire segment are respectively electrically interconnected with corresponding conductive traces exposed on the bottom face of the patch by a solder layer.

At least one and, preferably, each solder layer extends generally longitudinally of the segment traces, out slightly beyond an edge of the patch overlying the respective flatwire segment. The edge of the patch overlying the respective flatwire segment is either a longitudinal end of the patch or, preferably, is an edge defined by a peripheral portion of an aperture or "window" defined in the patch. The solder layer extensions atop the segment traces permit a visual inspection of the resulting flatwire assembly, by which to confirm the successfully electrical interconnection between the respective traces of the patch and each flatwire segment.

In accordance with another aspect of the invention, the patch preferably includes a flexible substrate defining longitudinal extensions that overlie respective portions of each flatwire segment that are farther removed from the segment's end than the visible solder layer extensions. Further, the flatwire assembly's adhesive layer preferably extends between the patch substrate extensions and the corresponding portions of the flatwire segments such that, once the patch is bonded to the flatwire segments, the patch substrate extensions advantageously provide improved mechanical strain relief to the resulting flatwire assembly.

Also under the invention, a method is provided for interconnecting a pair of flatwire segments, each flatwire segment including a top face, a longitudinal end, and a plurality of conductive traces exposed on the top face proximate to the longitudinal end. The method includes positioning a patch directly atop the opposed ends of the flatwire segments, with the patch including a generally-flat, flexible substrate, a bottom face, a top face, a plurality of edges, a plurality of conductive traces exposed on the bottom face of the patch, and a solder layer formed on the traces of the patch.

The method also includes applying heat and pressure to a portion of the top face of the patch overlying the solder layer to thereby reflow the solder layer generally along the traces of the flatwire segments to a point slightly beyond a respective one of the edges of the patch, whereby at least one solder layer extension is formed on a given trace of each segment. The method further includes inspecting the solder layer extensions to confirm an electrical interconnection by the solder layer of the respective traces of the patch and the segments. The method preferably also includes covering the solder layer extensions with a protective layer after inspecting, as with a self-adhesive tape cover.

In accordance with another aspect of the invention, the method preferably includes preparing the patch by applying the solder layer to the traces of the patch, prior to position the patch atop the segment ends, either as a solder paste by stenciling or as solder plating. The ends of the segments are preferably prepared by applying a flux to the traces of the segments prior to positioning the patch.

In accordance with yet another aspect of the invention, the method preferably includes applying a layer of either a thermally-cured adhesive or a pressure-sensitive adhesive to a portion of the bottom face of the patch prior to positioning the patch atop the segment ends. By way of example only, in a preferred method, the adhesive is a thermoplastic adhesive having a curing temperature lower than the reflow temperature of the solder. The adhesive is thereby advantageously formed into a suitable adhesive layer and activated/cured during the step of applying heat and pressure to reflow the solder layer.

Additional features, benefits, and advantages of the invention will become apparent to those skilled in the art to which the invention relates from the subsequent description of several exemplary embodiments and the appended claims, taken in conjunction with the accompanying Drawings.

BRIEF DESCRIPTION OF THE DRAWINGS

In the Drawings, wherein like reference numerals are used to designate like components in each of the several views, and wherein the relative thickness of certain components has been increased for clarity of illustration:

FIG. 1 is a view in perspective of a first exemplary flatwire assembly that includes a pair of flatwire segments whose ends have been interconnected in accordance with the invention, with the top cover partially broken away for clarity;

FIG. 2 is a top view of the first flatwire assembly, with the top cover removed;

FIG. 3 is a sectional view of the first flatwire assembly, taken along line 3—3 of FIG. 2, but further showing the assembly's top cover;

FIG. 4 is a bottom view of the jumper patch of the first flatwire assembly, immediately before being placed atop the juxtaposed longitudinal ends of the two flatwire segments;

FIG. 5 is a perspective view of a jumper patch being placed atop of the juxtaposed ends of the two flatwire segments, further showing the prepared segment ends;

FIG. 6 is a top view of the first flatwire assembly during manufacture, with the jumper patch positioned directly atop the ends of the flatwire segments, and further illustrating, in broken lines, a first heating zone upon which heat is applied under pressure to cause reflow of the pre-applied solder layer during assembly manufacture, and a second heating zone upon which heat is applied under pressure to cause both reflow of the pre-applied solder layer and cure of the adhesive layer during assembly manufacture; and FIG. 7 is a top view a second exemplary flatwire assembly, in accordance with another aspect of the invention.

DETAILED DESCRIPTION OF THE INVENTION

A first exemplary flatwire assembly 10 in accordance with the invention, featuring a pair of flatwire segments 12 that are electrically- and mechanically-interconnected by a flatwire "jumper" patch 14, is illustrated in FIGS. 1–4. Each flatwire segment includes a generally flat, flexible substrate 16 generally defining a top face 18 and a longitudinal end 20 of the flatwire segment 12. A plurality of longitudinally-extending electrically-conductive traces 22 are secured, as by an adhesive layer (not shown), to the top face 18 of the flatwire substrate 12. As best seen in the cross-sectional view of FIG. 3, while the traces 22 along the length of each flatwire segment 12 are generally covered with an electrically-insulative polymeric masking layer 24, in order to expose the traces 22 on the respective longitudinal end 20 of each flatwire segment 12, the masking layer 24 proximate to each segment's longitudinal end 20 is either omitted during fabrication or removed in a preliminary step, as illustrated in FIG. 5.

Returning to FIGS. 2 and 3, the flatwire jumper patch 14 of the first flatware assembly 10 similarly includes a generally-flat, flexible substrate 26 defining a bottom face 28 of the patch 14. A pair of generally rectangular apertures 30 are formed in the patch substrate 26, each aperture 30 exposing a portion 32 of the top face 18 of a respective flatware segment 12. A peripheral portion of each aperture 30 defines a respective edge 34 on the pa patch 14 that overlies the traces 22 exposed on the top face 18 of the flatwire segment 12. As best seen in the bottom view of the patch illustrated in FIG. 4, a plurality of electrically-conductive traces 36, formed of a suitable material such as copper, are exposed on the bottom face 28 of the patch 14.

Returning to FIG. 3, a solder layer 38 is disposed between respective pairs of the exposed traces 36,22 of the patch 14 and the segments 12 to thereby electrically interconnect the traces 22 of the flatwire segments 12 via the traces 36 of the patch 14. The invention contemplates use of any suitable type of solder 38, including, for example, a pre-plated solder, a solder paste dispensed onto the traces of the patch as with a stenciling process, or a solder pre-form.

As best seen in FIGS. 3 and 4, an adhesive layer 40 is also disposed between the respective top faces 18 of the flatwire segments 12 and the bottom face 28 of the patch 14, generally on portions of the bottom face 28 of the patch 14 adjacent to the traces 36 and about the periphery of the patch's bottom face 28. The adhesive layer 40 serves to further mechanically couple the patch 14 to each flatwire segment 12. While the invention contemplates use of any suitable adhesive, in the exemplary flatwire assembly 10, the adhesive layer is a thermally-cured adhesive, such as an epoxy or urethane having a curing temperature lower than the reflow temperature of the solder layer 38, or a pressure-sensitive adhesive, such as an acrylic- or silicone-based adhesive. By way of example only, where the adhesive is a thermally-cured thermoplastic, the adhesive is conveniently applied to the bottom face 28 of the patch 14 as an adhesive film.

As best seen in FIGS. 2 and 3, the solder layers 38 bridging the traces 36, 22 of the patch 14 and the segments 12 each include longitudinal extensions 42 that extend out beyond the adjacent edge 34 of the patch substrate 26, into the "window" or "inspection area" defined by the aperture 30. As described further below, the solder layer extensions 42 are formed by applied heat and pressure during solder reflow. The solder layer extensions 42 permit an inspection of the resulting electrical interconnect achieved between the respective traces 36, 22 of the patch 14 and flatwire segments 12, prior to encapsulation of the interconnected segments 12 and patch 14 between two sheets of self-adhesive covers 44.

It is noted that the patch's flexible substrate 26 is formed of a suitable material, preferably selected to minimize the effect on the patch substrate of a subsequent application of heat and pressure that is required to reflow the solder layers 38, and to form and activate/cure the adhesive layer 40 bonding the patch 14 to the ends 20 of the flatwire segments 12. By way of further example, when the substrate 16, 26 of any of the flatwire segments 12 or the patch 14 is formed of a relatively-low-temperature thermoplastic material such as polyethylene terephthalate (PET), the pressure applied during solder reflow is preferably tailored to control and/or limit the flow of the substrate 16, 26.

Referring again to FIG. 3, in accordance with another aspect of the invention, the patch substrate 26 includes longitudinal extensions 46 that overlie respective portions 48 on the top face 18 of each flatwire segment 12 that are farther removed from the segment's end 20 than the visible solder layer extensions 42. And, as best seen in FIG. 3, the flatwire assembly's adhesive layer 40 extends between the patch substrate extensions 46 and the corresponding portions 48 of the flatwire segments 12 such that, once the patch 14 is bonded to the segments 12, the patch substrate extensions 46 advantageously provide improved mechanical strain relief to the resulting flatwire assembly 10.

Referring to FIGS. 5 and 6, under an exemplary method for practicing the invention, two flatwire segments 12, preferably of similar construction with a plurality of "mirror-image" conductive traces 22 extending longitudinally on the respective top face 18 of each segment's flexible substrate 16, are positioned relative to one another such that the segment ends 20 are placed in opposition, with the respective traces 22 of each segment 12 in substantial alignment. A suitable liquid flux 50 is preferably applied to each exposed trace 22 of the segments 12 before overlaying the patch 14 directly atop the opposed segment ends 20, to lower surface tension and to otherwise encourage generally longitudinal reflow of the solder layer relative to the segment's traces 22. The patch 14 is then positioned atop the opposed segment ends 20 such that the traces 36 of the patch 14 overlie the respective traces 22 of the segments 12. The alignment of the segments 12 and the patch 14 is facilitated, for example, through use of alignment holes 52, in conjunction with a fixture having complementary alignment pins (not shown).

Referring to FIG. 6, heat and pressure is then applied to the top face 54 of the patch in the vicinity of the solder layer 38, designated as the two first heating zones 56 in FIG. 6, to reflow the solder longitudinally relative to the flatwire segments 12 and thereby electrically interconnect the respective traces 36, 22 of the patch 14 and the segments 12. Additional heat and/or pressure is preferably also applied over nearly the entirety of the patch's top face 54, designated as the second heating zone 58 in FIG. 6, to form or otherwise activate/cure the adhesive layer 40 that bonds the patch 14 to each flatwire segment 12 (as shown in FIG. 4).

The solder layer extensions 42, which then appear as illustrated in FIG. 2, are inspected to confirm that the respective traces 36,22 of the patch 14 and the flatwire segments 12 have been electrically interconnected by the assembly's solder layers 38, as illustrated in FIG. 3. A protective layer, such as a self-adhesive cover sheet 44, also as illustrated in FIG. 3, is applied over the bottom face 60 of each flatwire segment 12, and the respective top faces 18, 54 of the segments 12 and the patch 14, to thereby provide environmental protection for the resulting flatwire assembly 10.

A second exemplary flatwire assembly 62 in accordance with the invention is illustrated in FIG. 7 as including a pair of flatwire segments 12 whose longitudinal ends 20 are joined by a jumper patch 14. In the second flatwire assembly 62, the patch includes a polygonal peripheral edge 64 that serves to define both the edges 66 overlying the respective segment traces 22, out from which the solder layer 38 will longitudinally flow to form the desired solder layer extensions 42 for inspection, and a plurality of patch substrate extensions 68. The patch substrate extensions 68, each of which overlies a respective portion 70 of the upper face 18 of each segment 12 that is farther removed from the segment end 20 than the solder layer extensions 42, provides the second flatwire assembly 62 with enhanced strain relief.

While the above description constitutes the preferred embodiment, it will be appreciated that the invention is susceptible to modification, variation and change without departing from the proper scope and fair meaning of the subjoined claims. For example, while the flatwire segments of the exemplary flatwire assembly feature identical patterns of conductive traces, the invention is suitable for interconnecting flatwire segments whose traces are of different sizes. It will also be appreciated that the invention contemplates a wide variety of configurations of fixturing apertures and fiduciary marks to assure proper placement and maintenance of the patch and flatwire segments when interconnecting the flatwire segments under the invention.

What is claimed is:

1. A flatwire assembly comprising:

a pair of elongate flatwire segments respectively including a top face, a longitudinal end, and conductive traces exposed on the top face proximate to the longitudinal end, wherein the longitudinal end of one segment is placed in opposition with the longitudinal end of the other segment;

a generally-flat jumper patch having a bottom face directly overlying the opposed longitudinal ends of the segments, conductive traces exposed on the bottom face that overlie respective traces of each segment, a first edge overlying a given trace of one segment, and a second edge overlying a given trace of the other segment;

a solder layer respectively disposed between each trace of the patch and the corresponding trace of each segment, wherein the solder layer on the given trace of the one segment extends longitudinally atop the given trace beyond the first edge of the patch to thereby define a first solder layer extension visible atop the given trace of the one segment, and wherein the solder layer on the given trace of the other segment extends generally longitudinally atop the given trace beyond the second edge of the patch to thereby define a second solder layer extension visible atop the given trace of the other segment; and an adhesive layer disposed between the patch and each segment to secure the patch to each segment.

2. The flatwire assembly of claim 1, wherein the patch preferably includes a flexible substrate defining longitudinal extensions that overlie respective portions of each segment that are respectively farther removed from the segment end than the first and second solder layer extensions.

3. The flatware assembly of claim 2, wherein the adhesive layer extends between the extensions of the patch substrate and the respective overlaid portions of the flatwire segments.

4. The flatwire assembly of claim 1, wherein the adhesive layer extends to a point on the top face of the one segment that is farther removed from the segment end than the first solder layer extension.

5. The flatwire assembly of claim 1, wherein the adhesive layer is disposed between a pair of traces on the bottom face of the patch.

6. The flatwire assembly of claim 1, wherein the adhesive layer is formed of a thermally-cured adhesive.

7. The flatwire assembly of claim 1, wherein the adhesive layer is formed of a pressure sensitive adhesive.

8. The flatware assembly of claim 1, wherein the first edge of the patch is defined by a first peripheral portion of a first aperture formed in the patch substrate.

9. The flatwire assembly of claim 8, wherein the second edge of the patch is defined by a peripheral portion of a second aperture formed in the patch substrate.

10. The flatwire assembly of claim 8, wherein the second edge of the patch is defined by a second peripheral portion of the first aperture.

11. The flatwire assembly of claim 8, further including a protective layer covering the solder layer extensions.

12. The flatwire assembly of claim 1, wherein the first and second edges extend in a direction generally normal to the respective traces of the segments.

* * * * *